(12) United States Patent
Yoon

(10) Patent No.: US 10,113,705 B2
(45) Date of Patent: Oct. 30, 2018

(54) LIGHT SOURCE MODULE AND LIGHTING DEVICE HAVING THE SAME

(71) Applicant: SAMSUNG ELECTRONICS CO., LTD., Suwon-si (KR)

(72) Inventor: Young Jeong Yoon, Suwon-si (KR)

(73) Assignee: SAMSUNG ELECTRONICS CO., LTD., Suwon-si (KR)

(*) Notice: Subject to any disclaimer, the term of this patent is extended or adjusted under 35 U.S.C. 154(b) by 205 days.

(21) Appl. No.: 15/086,370

(22) Filed: Mar. 31, 2016

(65) Prior Publication Data

US 2017/0082257 A1   Mar. 23, 2017

(30) Foreign Application Priority Data

Sep. 17, 2015 (KR) .................. 10-2015-0131592

(51) Int. Cl.
| | |
|---|---|
| *F21S 41/19* | (2018.01) |
| *F21S 8/10* | (2006.01) |
| *F21S 41/141* | (2018.01) |
| *F21S 43/19* | (2018.01) |
| *F21S 43/14* | (2018.01) |
| *F21S 43/15* | (2018.01) |
| *F21S 45/47* | (2018.01) |

(52) U.S. Cl.
CPC ......... *F21S 48/1122* (2013.01); *F21S 41/141* (2018.01); *F21S 41/192* (2018.01); *F21S 41/198* (2018.01); *F21S 43/14* (2018.01); *F21S 43/15* (2018.01); *F21S 43/195* (2018.01); *F21S 45/47* (2018.01)

(58) Field of Classification Search
CPC .. F21S 48/1122; F21S 48/1109; F21S 48/212; F21S 41/198; F21S 41/192; F21S 45/47; F21S 43/195
See application file for complete search history.

(56) References Cited

U.S. PATENT DOCUMENTS

| | | | | |
|---|---|---|---|---|
| 4,822,302 A | * | 4/1989 | Dorleans | ............... F21S 48/1122 362/655 |
| 5,142,454 A | * | 8/1992 | Green | .................... B60Q 1/007 362/496 |
| 6,372,608 B1 | | 4/2002 | Shimoda et al. | |
| 6,645,830 B2 | | 11/2003 | Shimoda et al. | |
| RE38,466 E | | 3/2004 | Inoue et al. | |
| 6,709,137 B1 | * | 3/2004 | Glovak | .................. B60Q 1/323 362/495 |

(Continued)

FOREIGN PATENT DOCUMENTS

| | | |
|---|---|---|
| JP | 2000-100211 A | 4/2000 |
| JP | 2001-035209 A | 2/2001 |

(Continued)

*Primary Examiner* — Jong-Suk (James) Lee
*Assistant Examiner* — Christopher E Dunay
(74) *Attorney, Agent, or Firm* — Sughrue Mion, PLLC

(57) ABSTRACT

A light source module includes a frame comprising base portions disposed on different levels, respectively, and an electrode pattern disposed on the base portions. The light source module further includes light emitting portions detachably disposed on the respective base portions, and connections having elasticity, disposed between the respective light emitting portions and the frame, and configured to supply power to the light emitting portions through the electrode pattern.

19 Claims, 18 Drawing Sheets

(56) References Cited

U.S. PATENT DOCUMENTS

| | | |
|---|---|---|
| 6,818,465 B2 | 11/2004 | Biwa et al. |
| 6,818,530 B2 | 11/2004 | Shimoda et al. |
| 6,858,081 B2 | 2/2005 | Biwa et al. |
| 6,967,353 B2 | 11/2005 | Suzuki et al. |
| 6,998,650 B1 | 2/2006 | Wu |
| 7,002,182 B2 | 2/2006 | Okuyama et al. |
| 7,084,420 B2 | 8/2006 | Kim et al. |
| 7,087,932 B2 | 8/2006 | Okuyama et al. |
| 7,154,124 B2 | 12/2006 | Han et al. |
| 7,208,725 B2 | 4/2007 | Sherrer et al. |
| 7,288,758 B2 | 10/2007 | Sherrer et al. |
| 7,319,044 B2 | 1/2008 | Han et al. |
| 7,501,656 B2 | 3/2009 | Han et al. |
| 7,709,857 B2 | 5/2010 | Kim et al. |
| 7,759,140 B2 | 7/2010 | Lee et al. |
| 7,781,727 B2 | 8/2010 | Sherrer et al. |
| 7,790,482 B2 | 9/2010 | Han et al. |
| 7,940,350 B2 | 5/2011 | Jeong |
| 7,959,312 B2 | 6/2011 | Yoo et al. |
| 7,964,881 B2 | 6/2011 | Choi et al. |
| 7,985,976 B2 | 7/2011 | Choi et al. |
| 7,994,525 B2 | 8/2011 | Lee et al. |
| 8,008,683 B2 | 8/2011 | Choi et al. |
| 8,013,352 B2 | 9/2011 | Lee et al. |
| 8,049,161 B2 | 11/2011 | Sherrer et al. |
| 8,129,711 B2 | 3/2012 | Kang et al. |
| 8,179,938 B2 | 5/2012 | Kim |
| 8,263,987 B2 | 9/2012 | Choi et al. |
| 8,324,646 B2 | 12/2012 | Lee et al. |
| 8,399,944 B2 | 3/2013 | Kwak et al. |
| 8,432,511 B2 | 4/2013 | Jeong |
| 8,459,832 B2 | 6/2013 | Kim |
| 8,502,242 B2 | 8/2013 | Kim |
| 8,536,604 B2 | 9/2013 | Kwak et al. |
| 8,735,931 B2 | 5/2014 | Han et al. |
| 8,766,295 B2 | 7/2014 | Kim |
| 2008/0253145 A1* | 10/2008 | Biarne .................. H05K 1/189 362/548 |
| 2013/0294056 A1 | 11/2013 | Eibner et al. |
| 2014/0218954 A1* | 8/2014 | Yoon ...................... H01L 33/62 362/546 |
| 2016/0219708 A1* | 7/2016 | Aiso ..................... H05K 3/105 |
| 2016/0290586 A1* | 10/2016 | Shido ................... F21S 48/212 |
| 2016/0290587 A1* | 10/2016 | Nakagawa .......... F21S 48/2212 |
| 2017/0045190 A1* | 2/2017 | Song ................... F21S 48/1109 |
| 2017/0167716 A1* | 6/2017 | Ezaki .................... F21V 29/87 |

FOREIGN PATENT DOCUMENTS

| | | |
|---|---|---|
| JP | 2006-128214 A | 5/2006 |
| KR | 10-0904211 B1 | 6/2009 |
| KR | 10-2010-0002455 A | 1/2010 |
| KR | 10-0982939 B1 | 9/2010 |
| KR | 20-2011-0004309 U | 5/2011 |
| KR | 10-1231220 B1 | 2/2013 |
| KR | 10-2013-0056645 A | 5/2013 |
| KR | 10-2014-0020242 A | 2/2014 |
| WO | 2014/132126 A2 | 9/2014 |

* cited by examiner

A

LIGHT SOURCE MODULE AND LIGHTING DEVICE HAVING THE SAME

CROSS-REFERENCE TO RELATED APPLICATION

This application claims priority from Korean Patent Application No. 10-2015-0131592 filed on Sep. 17, 2015, with the Korean Intellectual Property Office, the disclosure of which is incorporated herein by reference in its entirety.

BACKGROUND

1. Field

Apparatuses consistent with example embodiments relate to a light source module and a lighting device having the same.

2. Description of the Related Art

Light source modules, in which a plurality of light emitting diodes (LEDs) is arranged according to a design of a structure, have been widely used in vehicle headlamps. In such light source modules, the arrangement structures of LEDs are determined according to the designs of headlamps intended for various models of vehicles.

As for light source modules used for vehicle headlamps, new mold patterns may be designed and manufactured each time a vehicle is designed to allow light source modules fitting designs of lamps of corresponding models to be manufactured. The designed and manufactured mold patterns may be kept and managed until vehicle models corresponding to the molds are discontinued.

SUMMARY

One or more example embodiments provide a scheme of standardizing a structure of a light emitting unit installed in a light source module such that the light emitting unit may be used regardless of vehicle model, and maintenance thereof is facilitated.

According to example embodiments, a light source module includes a frame including base portions disposed on different levels, respectively, and an electrode pattern disposed on the base portions. The light source module further includes light emitting portions detachably disposed on the respective base portions, and connections having elasticity, disposed between the respective light emitting portions and the frame, and configured to supply power to the light emitting portions through the electrode pattern.

Each of the connections may include a first body portion disposed on a respective one of the light emitting portions, a bent portion integrally extending from an end of the first body portion, and a second body portion integrally extending from an end of the bent portion and facing the first body portion. The bent portion may be configured to elastically deform in response to external force that is applied to the bent portion, to generate repellent force.

The second body portion may include a contact portion bent outwardly from an end of the second body portion, the contact portion contacting the electrode pattern.

A pair of the connections may be disposed on a surface of each of the light emitting portions, the surface facing a respective one of the base portions. The pair of the connections may be further disposed on the electrode pattern.

The frame may have a stepwise structure in which the base portions are disposed on gradually higher levels in an arrangement direction.

The frame may include fixing members protruding from edges of each of the base portions to face each other, the fixing members being configured to fix the light emitting portions to the respective base portions.

The fixing members may include protrusions.

The frame may include through holes disposed in the respective base portions.

The frame may further include a support member protruding from a surface of each of the base portions, the support member being configured to space apart each of the light emitting portions from a respective surface of the base portions.

The frame may further include a fastening boss protruding from a surface of each of the base portions, the fastening boss being configured to fasten each of the light emitting portions to restrain slidable movement of each of the light emitting portions.

The frame may further include a connection portion disposed between the base portions, the connection portion connecting the base portions, and the connection portion being vertically connected to each of the base portions.

Each of the light emitting portions may include a board including a circuit, and a light emitting device disposed on the board.

The light emitting portion may further include a heat dissipation member disposed below the board.

The electrode pattern may be exposed externally on an upper or lower surface of each of the base portions, and the light emitting portions may be disposed on the exposed electrode pattern.

According to example embodiments, a light source module includes a frame including a surface having a stepwise structure, and including an electrode pattern exposed externally on the surface. The light source module further includes light emitting portions detachably disposed on different levels of the surface, and connections disposed on the respective light emitting portions, and configured to connect to the electrode pattern to provide power to the light emitting portions disposed on the different levels of the surface.

In response to the light emitting portions being disposed on the different levels of the surface, the connections may be configured to generate repellent force toward the electrode pattern.

The surface may be an upper or lower surface of the frame, and the connections may be disposed between the respective light emitting portions and the electrode pattern.

According to example embodiments, a lighting device includes a light source module, a housing supporting the light source module, and a cover fastened to the housing to cover the light source module. The light source module includes a frame including base portions disposed on different levels, respectively, and an electrode pattern exposed externally on the mounting regions. The light source module further includes light emitting portions detachably disposed on the respective mounting regions, and connections having elasticity, disposed between the respective light emitting portions and the frame, and configured to supply power to the light emitting portions through the electrode pattern.

The lighting device may further include a reflector configured to reflect light from the light source module.

The reflector may include reflective surfaces, and through holes disposed in a bottom surface of each of the reflective surfaces, the through holes exposing the reflective surfaces to the respective light emitting portions.

According to example embodiments, a light source module includes base portions disposed on different levels, respectively, an electrode pattern disposed on the base portions, light emitting portions detachably disposed on the respective base portions, and connections disposed on the respective light emitting portions, and configured to connect to the electrode pattern in response to the light emitting portions being disposed on the respective base portions.

The light source module may further include a guide member disposed on each of the base portions, and configured to guide a position of each of the light emitting portions disposed on the respective base portions.

Each of the light emitting portions may include a heat dissipation member and a circuit board disposed on the heat dissipation member, the heat dissipation member and the circuit board may include respective fastening holes, and the light source module may further include a fastening boss disposed on each of the base portions, the fastening boss being configured to be inserted into the fastening holes to fasten a respective one of the base portions to a respective one of the light emitting portions.

The light emitting portion may further include heat dissipation fins vertically extending from opposite edges of the heat dissipation member.

The light source module may further include fixing members having elasticity, disposed on opposite edges of each of the base portions, including protrusions, and configured to fix the light emitting portions to the respective base portions so that the protrusions are disposed on the respective light emitting portions.

BRIEF DESCRIPTION OF DRAWINGS

The above and/or other aspects will be more apparent by describing example embodiments with reference to the accompanying drawings.

DETAILED DESCRIPTION

Figure 1:
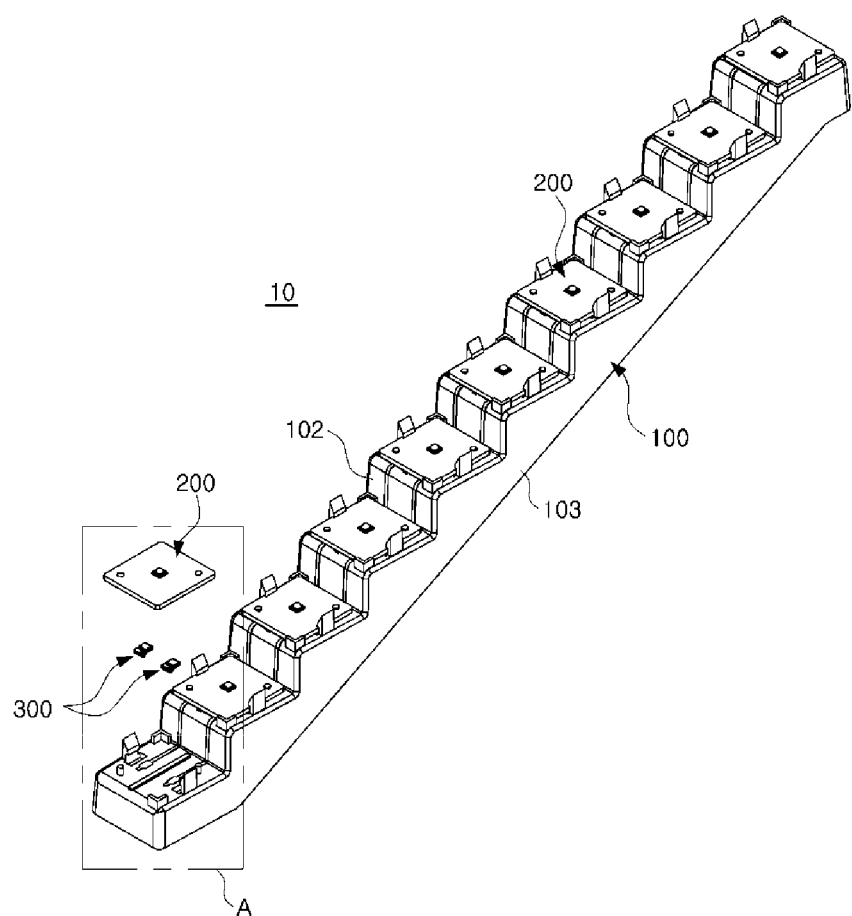
FIG. 1 is a perspective view illustrating a light source module according to example embodiments.

Hereinafter, example embodiments will be described as follows with reference to the attached drawings.

The example embodiments may, however, be exemplified in many different forms and may not be construed as being limited to the example embodiments set forth herein. Rather, these example embodiments are provided so that this disclosure will be thorough and complete, and will fully convey the scope of the disclosure to those skilled in the art.

Throughout the specification, it will be understood that when an element, such as a layer, region or wafer (substrate), is referred to as being "on," "connected to," or "coupled to" another element, it can be directly "on," "connected to," or "coupled to" the other element or other elements intervening therebetween may be present. In contrast, when an element is referred to as being "directly on," "directly connected to," or "directly coupled to" another element, there may be no elements or layers intervening therebetween. Like numerals refer to like elements throughout. As used herein, the term "and/or" includes any and all combinations of one or more of the associated listed items.

It will be apparent that though the terms first, second, third, etc. may be used herein to describe various members, components, regions, layers and/or sections, these members, components, regions, layers and/or sections may not be limited by these terms. These terms are only used to distinguish one member, component, region, layer or section from another region, layer or section. Thus, a first member, component, region, layer or section discussed below could be termed a second member, component, region, layer or section without departing from the teachings of the example embodiments.

Spatially relative terms, such as "above," "upper," "below," and "lower" and the like, may be used herein for ease of description to describe one element's relationship to another element(s) as shown in the figures. It will be understood that the spatially relative terms are intended to encompass different orientations of the device in use or operation in addition to the orientation depicted in the figures. For example, if the device in the figures is turned over, elements described as "above" or "upper" other elements would then be oriented "below" or "lower" the other elements or features. Thus, the term "above" can encompass both the above and below orientations depending on a direction of the figures. The device may be otherwise oriented (rotated 90 degrees or at other orientations) and the spatially relative descriptors used herein may be interpreted accordingly.

The terminology used herein is for describing the example embodiments only and is not intended to be limiting. As used herein, the singular forms "a," "an," and "the" are intended to include the plural forms as well, unless the context clearly indicates otherwise. It will be further understood that the terms "comprises" and/or "comprising" when used in this specification, specify the presence of stated features, integers, steps, operations, members, elements, and/or groups thereof, but do not preclude the presence or addition of one or more other features, integers, steps, operations, members, elements, and/or groups thereof.

Hereinafter, the example embodiments will be described with reference to schematic views illustrating the example embodiments. In the drawings, for example, due to manufacturing techniques and/or tolerances, modifications of the shape shown may be estimated. Thus, the example embodiments may not be construed as being limited to the shapes of regions shown herein, for example, to include a change in shape results in manufacturing. The following example embodiments may also be constituted by one or a combination thereof.

The contents of the example embodiments described below may have a variety of configurations and propose only an example configuration herein, but are not limited thereto.

Figure 2:
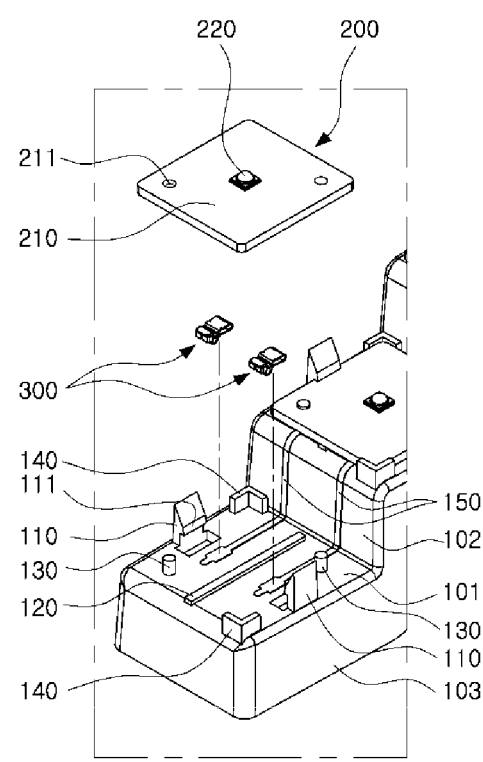
FIG. 2 is an enlarged perspective view of a portion "A" of the light source module of FIG. 1.

FIG. 1 is a perspective view illustrating a light source module according to example embodiments. FIG. 2 is an enlarged perspective view of a portion "A" of the light source module of FIG. 1.

As illustrated in FIGS. 1 and 2, a light source module 10 according to example embodiments includes a frame 100, a light emitting portion 200, and a connection 300.

The frame 100 includes a plurality of base portions 101, and the plurality of base portions 101 are arranged to be positioned on different levels. The frame 100 may be connected such that the plurality of base portions 101 are positioned on different levels and may have a stepwise structure in which the levels of the plurality of base portions 101 rise in one arrangement direction. That is, the frame 100 may have a stepped structure in which the plurality of base portions 101 is disposed on gradually higher positional levels to be arranged in a lengthwise direction of the frame 100.

Figure 3:
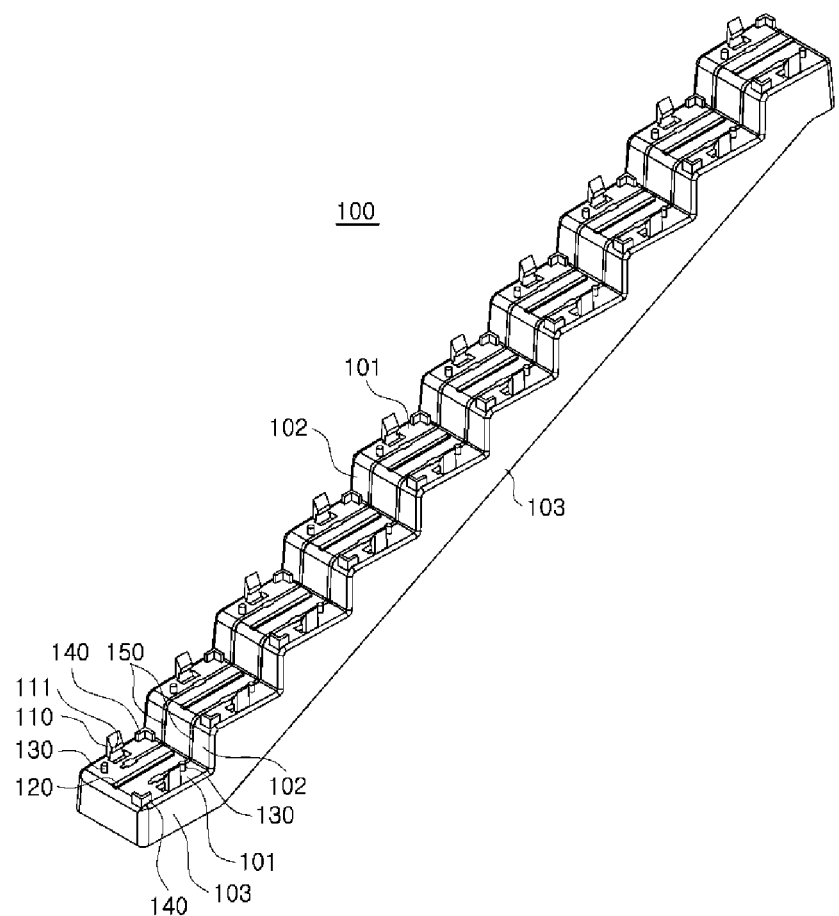
FIG. 3 is a perspective view illustrating a frame of the light source module of FIG. 1.

FIG. 3 is a perspective view illustrating the frame of the light source module of FIG. 1. Referring to FIGS. 1 to 3, the frame 100 includes the plurality of base portions 101, a connection portion 102 connecting the plurality of base portions 101, and a side portion 103.

The plurality of base portions 101 are disposed to be on different levels. That is, the plurality of base portions 101 may be disposed to have different heights. In the example embodiments, each of the base portions 101 is illustrated as having a quadrangular shape, but the shape of the base portions 101 is not limited thereto.

A surface of the base portion 101 may define an installation surface on which the light emitting portion 200 as described hereinafter is installed.

The base portion 101 includes a fixing member 110 protruding from a surface thereof. A pair of the fixing members 110 is disposed on both edges of each of the base portions 101 and face each other. Each of the fixing members 110 includes a protrusion 111 protruding toward another protrusion.

The fixing members 110 may selectively fixedly catch the light emitting portion 200 installed on the base portion 101 through the protrusions 111.

The base portion 101 includes a support member 120 provided on the surface from which the fixing members 110 protrude. The support member 120 may support the light emitting portion 200 installed on the base portion 101.

The support member 120 may be positioned in a central region of the surface of the base portion 101, and may extend in the arrangement direction. The support member 120 may protrude to have a height lower than the pair of the fixing members 110. Thus, the light emitting portion 200 installed on the base portion 101 may be spaced apart from the surface of the base portion 101 by an amount equal to a height of the support member 120 due to the support member 120.

The base portion 101 includes a fastening boss 130 provided on the surface from which the fixing member 110 protrudes. The fastening boss 130 may be fastened to the light emitting portion 200 installed on the base portion 101 to restrain slidable movement of the light emitting portion 200. Thus, the light emitting portion 200 may be prevented from being moved unintendedly in a direction horizontal to the surface of the base portion 101 to be separated therefrom.

The fastening boss 130 may protrude from the surface of the base portion 101 to have a height greater than the support member 120, and is disposed on both sides, i.e., left and right sides, of the support member 120. In example embodiments, it is illustrated that two fastening bosses 130 are disposed in a diagonal direction with the support member 120 interposed therebetween, but the positions of the fastening bosses 130 are not limited thereto.

The base portion 101 includes a guide member 140 provided on the surface from which the fixing member 110 protrudes. The guide member 140 may guide an installation position of the light emitting portion 200 installed on the base portion 101. For example, both corners of the light emitting portion 200 in a diagonal direction are in contact with the guide members 140.

The guide members 140 are disposed on both sides, i.e., left and right sides, of the support member 120. In this case, a pair of the guide members 140 is disposed in a diagonal direction of the direction in which a pair of the fastening bosses 130 cross.

The guide members 140 may be selectively provided. Thus, the guide members 140 may be omitted according to example embodiments.

The connection portion 102 is disposed between the plurality of base portions 101, and connects two adjacent base portions 101 positioned on different levels. That is, the connection portion 102 extends from one side of one base portion 101 positioned relatively upwardly to the other side of another base portion 101 positioned relatively downwardly.

In the example embodiments, it is illustrated that the connection portion 102 is connected to be substantially perpendicular to each of the base portions 101, but is not limited thereto. For example, the connection portion 102 may be connected to be sloped at a predetermined slope.

The side portion 103 extends from both edges of the plurality of base portions 101 in a width direction to a direction substantially perpendicular thereto. A pair of the side portions 103 defines side surfaces of the frame 100.

In example embodiments, it is illustrated that the frame 100 extends to have an overall linear shape in a length direction, but is not limited thereto. For example, the frame 100 may have a curved shape with a curved surface.

The frame 100 may be formed by injecting a resin such as polycarbonate (PC) or polymthylmethacrylate (PMMA) into a mold and solidifying the resin. For example, a method such as injection molding, transfer molding, or compression molding may be used.

The frame 100 includes an electrode pattern 150 provided in the plurality of base portions 101. The electrode pattern 150 is disposed on a surface of the frame 100 having a stepwise structure, i.e., on an upper surface or a lower surface of the based portion 101 and the connection portion 102, and exposed externally. The electrode pattern 150 may extend as a pair to be parallel in an arrangement direction of the plurality of base portions 101.

The electrode pattern 150 may be formed of a metal having conductivity and electrically connected to the light emitting portion 200 to supply power to the light emitting portion 200.

The light emitting portion 200 may be detachably attached to each of the base portions 101. For example, the light emitting portion 200 may be installed on an upper surface of the base portion 101 from which the electrode pattern 150 is exposed. Thus, the plurality of light emitting portions 200 may be disposed on different levels along the stepwise structure of the frame 100.

The light emitting portion 200 includes a board 210 including a circuit, and a light emitting device 220 installed on the board 210.

Figure 4A:
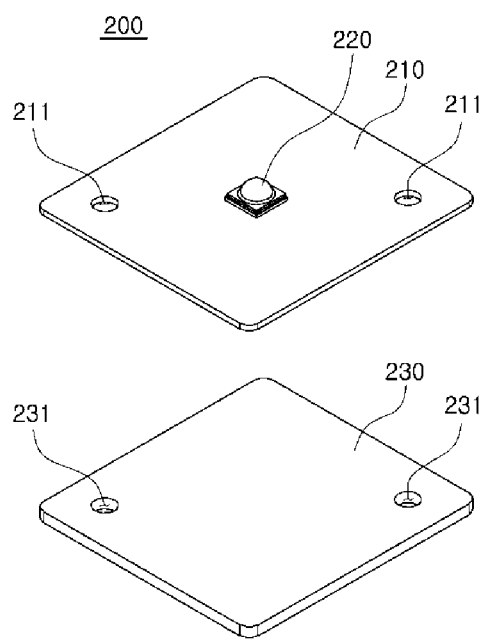
FIGS. 4A and 4B are perspective views illustrating a light emitting portion of the light source module of FIG. 1.
Figure 4B:
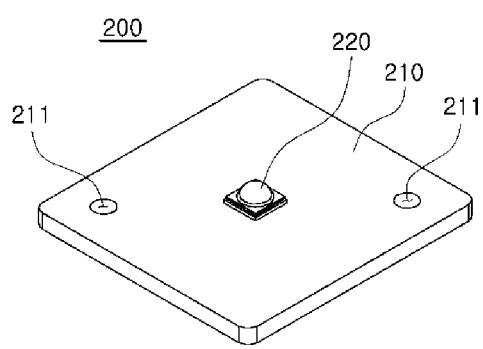

FIGS. 4A and 4B are perspective views illustrating the light emitting portion of the light source module of FIG. 1.

Referring to FIG. 4A, the board 210 may be a flexible printed circuit board (FPCB) that may be freely bent and deformed to have various shapes. In example embodiments, the board 210 may be a FR4-type PCB, may be formed of a resin containing an epoxy, triazine, silicon, and polyimide, or may be formed of ceramic such as a silicon nitride, AlN, or $Al_2O_3$. In this case, a heat dissipation member 230 is disposed below the board 210.

The heat dissipation member 230, a sort of a heat sink, may support the board 210 and dissipate heat generated by the light emitting device 220. The heat dissipation member 230 may be formed of a material having excellent heat conductivity to have improved heat dissipation efficiency. For example, the heat dissipation member 230 may be formed of a metal but is not limited thereto. Also, the heat dissipation member 230 may be mass-produced through a progressive mold, a semi-progressive mold, or a dicasting mold.

Referring to FIG. 4B, the board 210 may be formed of a metal and a metal compound and may include, for example, a metal-core printed circuit board (MCPCB) or a metal copper clad laminate (MCCL). In this case, the heat dissipation member 230 may be omitted.

In the example embodiments, it is described that the board 210 includes the heat dissipation member 230.

Referring again to FIGS. 2, 4A, and 4B, the board 210 and the heat dissipation member 230 may respectively include fastening holes 211 and 231 through which the fastening boss 130 is inserted. Thus, the light emitting portion 200 may be installed on the base portion 101 by inserting the fastening boss 130 into the fastening holes 211 and 231 of the board 210 and the heat dissipation member 230.

The light emitting device 220 may be an optoelectronic device generating light having a predetermined wavelength by externally-supplied driving power. For example, the light emitting device 220 may include a semiconductor LED having an n-type semiconductor layer, a p-type semiconductor layer, and an active layer interposed therebetween, or an LED package including the same.

The light emitting device 220 may emit blue light, green light, or red light or may emit white light or UV light according to a material contained therein or a combination with a phosphor. The light emitting devices 220 may be variously configured, such as the same type of light emitting devices generating light having the same wavelength or different types of light emitting devices generating light having different wavelengths. The light emitting device 220 may be variously configured according to electric power levels such as 0.5 W or 1 W.

As the light emitting device 200, LED chips having various structures or various types of LED packages having such LED chips provided therein may be used. In the example embodiments, a case in which the light emitting device 220 is an LED package is illustrated, but it not limited thereto. A configuration and structure of the light emitting device 220 will be described hereinafter.

The connection 300 may be interposed between the plurality of light emitting portions 200 and the frame 100 to supply power to the plurality of light emitting portions 200 through the electrode pattern 150.

Figure 5A:
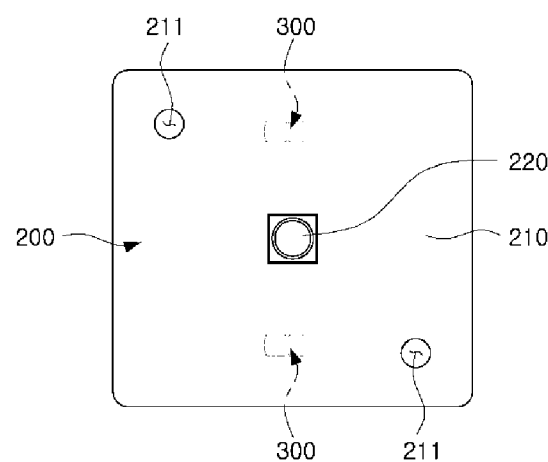
FIGS. 5A and 5B are a plan view and a side view illustrating a state in which a connection is attached to the light emitting portion of the light source module of FIG. 1.
Figure 5B:
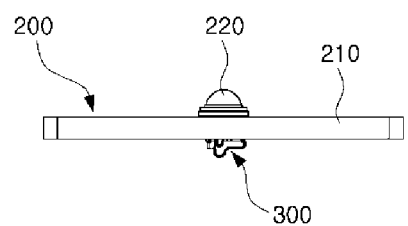

FIGS. 5A and 5B are a plan view and a side view illustrating a state in which the connection is attached to the light emitting portion of the light source module of FIG. 1.

Referring to FIGS. 5A and 5B, at least a pair of the connections 300 is attached to one surface, for example, a lower surface, of the light emitting portion 200 facing the base portion 101. Here, the connections 300 are electrically connected to the circuit of the board 210.

The connections 300 may be disposed to respectively correspond to positions of the electrode pattern 150 on the lower surface of each of the light emitting portions 200. Thus, when the plurality of light emitting portions 200 are installed in the frame 100, the connections 300 may come into contact with the electrode patterns 150 to supply power to the plurality of light emitting portions 200.

The connections 300 may be, for example, a sort of a leaf spring and may have elasticity.

Figure 6A:
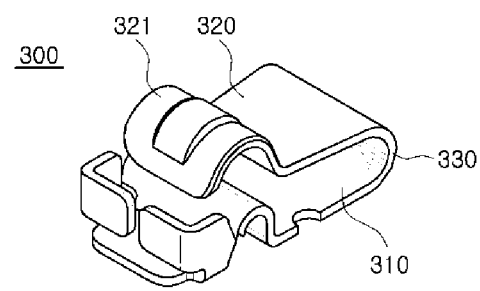
FIGS. 6A, 6B, and 6C are perspective views and a side view illustrating the connection of the light source module of FIG. 1.
Figure 6B:
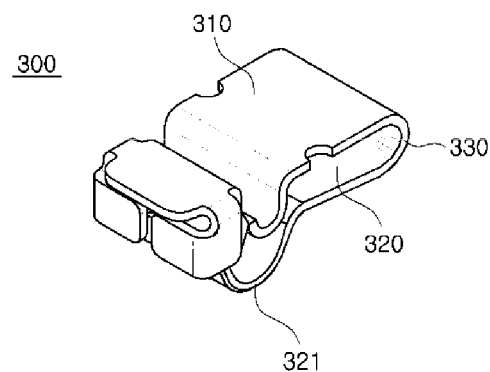
Figure 6C:
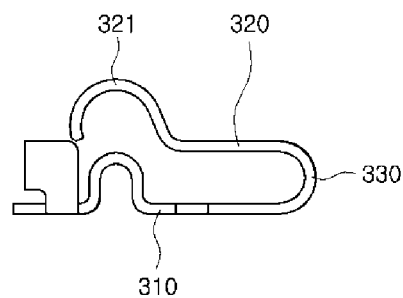

FIGS. 6A through 6C are perspective views and a side view illustrating the connection of the light source module of FIG. 1.

Referring to FIGS. 6A through 6C, the connection 300 includes a first body portion 310 attached to the light emitting portion 200, a bent portion 330 integrally extending from one end of the first body portion 310, and a second body portion 320 integrally extending from one end of the bent portion 330 and facing the first body portion 310.

The first body portion 310 and the second body portion 320 are integrally connected through the bent portion 330, may be spaced apart from one another by a predetermined interval, and extend substantially in parallel to each other. The second body portion 320 includes a contact portion 321 bent upwardly from an end portion, forming a step with respect to the second body portion 320, and connected to the electrode pattern 150.

The bent portion 330 may have a curved structure having a substantially C shape, and may be elastically deformed to generate repellant force in response to external force applied thereto.

The connection 300 may be formed of a material having electrical conductivity. For example, the connection 300 may be formed of a metal. However, the material of the connection 300 is not limited to a metal.

Figure 7A:
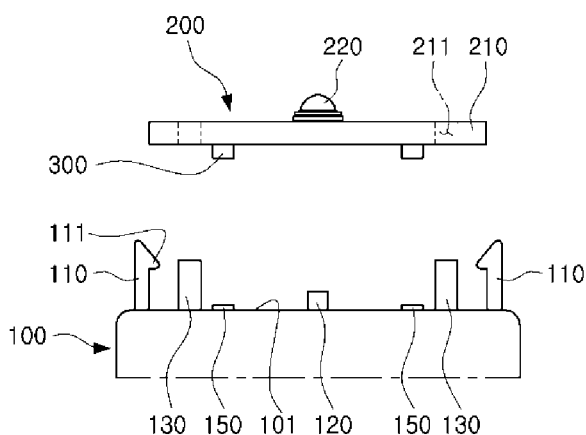
FIGS. 7A, 7B, and 7C are side views illustrating a process of installing the light emitting portion with the connection attached thereto, to a base portion of the light source module of FIG. 1.
Figure 7B:
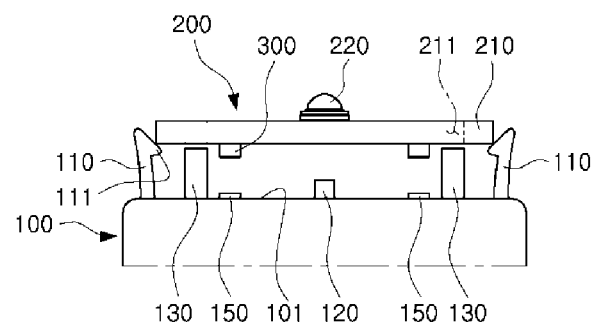
Figure 7C:
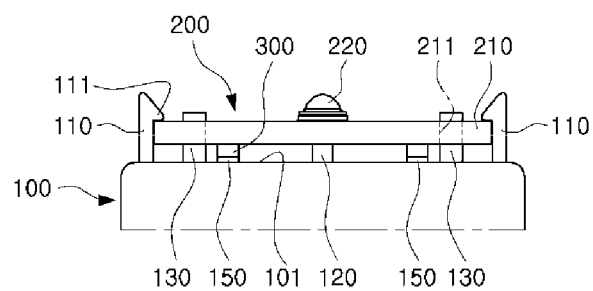
Figure 8A:
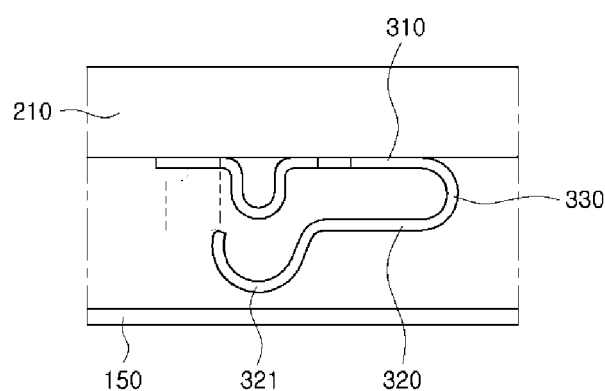
FIGS. 8A and 8B are side views illustrating a state in which the connection of the light source module of FIG. 1 is deformed.
Figure 8B:
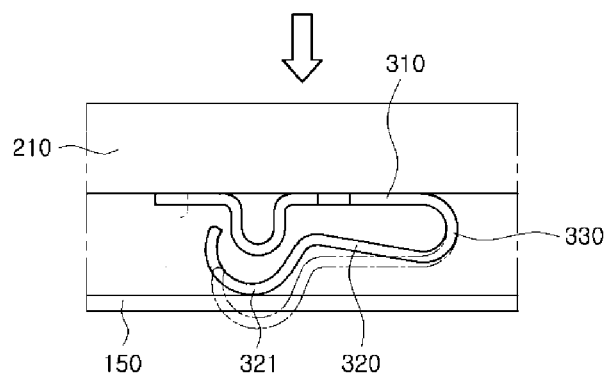

FIGS. 7A through 7C are side views illustrating a process of installing the light emitting portion with the connection attached thereto, to the base portion of the light source module of FIG. 1. FIGS. 8A and 8B are side views illustrating a state in which the connection of the light source module of FIG. 1 is deformed.

First, as illustrated in FIG. 7A, the light emitting portion 200 may be disposed on the base portion 101. A pair of the connections 300 is attached to a surface, for example, a bottom surface, of the light emitting portion 200 facing the base portion 101. The pair of the connections 300 may be attached to positions corresponding to the electrode patterns 150 disposed on the surface of the base portion 101.

As illustrated in FIG. 7B, in a state in which the light emitting portion 200 is placed on the base portion 101, when the light emitting portion 200 is moved toward the base portion 101 by force applied from above the light emitting portion 200, the pair of the fixing members 110 are pushed outwardly by the light emitting portion 200.

As illustrated in FIG. 7C, when the light emitting portion 200 is placed on the support member 120 and installed on the base portion 101, the pair of the fixing members 110 are returned to the original positions by elasticity. Accordingly, the light emitting portion 200 is fixedly caught by the protrusions 111 of the fixing members 110, and as the fastening bosses 130 are inserted into the fastening holes 211, the light emitting portion 200 is installed on the base portion 101, while maintained in a stably fixed state.

In a state in which the light emitting portion 200 is not installed on the base portion 101 as illustrated in FIGS. 7A and 7B, the connection 300 is not in contact with the electrode pattern 150 of the base portion 101 as illustrated in FIG. 8A. Thus, the first body portion 310 and the second body portion 320 may be maintained in a substantially parallel state.

In a state in which the light emitting portion 200 is installed on the base portion 101 as illustrated in FIG. 7C, the connection 300 is maintained in a state in which a contact portion 321 of the second body portion 320 is in contact with the electrode pattern 150, and the second body portion 320 is pressed toward the first body portion 310 as illustrated in FIG. 8B. Accordingly, the bent portion 330 is elastically deformed to generate repellent force, and the second body portion 320 applies force in a direction toward the electrode pattern 150 by the repellent force to cause the contact portion 321 to be maintained in a state of being in contact with the electrode pattern 150.

Thus, the light emitting portion 200 installed on the base portion 101 is maintained to be electrically connected to the electrode pattern 150 through the connection 300.

The plurality of light emitting portions 200, which have the standardized shape and are mass-produced, may be assembled in an amount to form the light source module 10 having the stepwise structure.

Because the light emitting portion 200 and the connection 300 have a standardized shape, they may be used regardless of automobile model. Also, the light emitting portion 200 and the connection 300 may be assembled in an amount in the frame 100 to easily manufacture the light source module 10 satisfying design conditions of each model. For example, a headlamp, a daytime running light (DRL), and a taillight of an automobile may have various designs, and to fit a portion having a curved shape, like a corner portion of an automobile, the light source module may have a stepped structure. That is, a step may be formed in every region in which each light emitting device is mounted.

In the related art, integrated light source modules having various numbers and structures of steps are individually manufactured. Also, to this end, molds fitting the respective models may be separately manufactured.

According to example embodiments, a light source module may be easily manufactured by assembling fewer or more light emitting portions 200 and the connections 300, which have a standardized shape to be used regardless of automobile model, in the frame 100 according to design structures of lamps for automobiles. Thus, there is no need to individually manufacture integrated light source modules having a plurality of steps for automobile models, and in addition, because there is no need to individually manufacture molds for models, an effect of reducing investment costs and manufacturing costs may be obtained.

Also, the light source module 10 according to example embodiments has a structure in which the light emitting portion 200 emitting light is individually selectively assembled and installed in the frame 100. Thus, when the light source module 10 cannot operate due to a fault of a light emitting portion 200 among the plurality of light emitting portions 200, only the light emitting portion 200 having the fault may be removed and substituted with a new one, facilitating maintenance. Thus, there is no need to discard the entire light source module 10 and replace it with a new module, and cost may not be increased accordingly.

Figure 9:
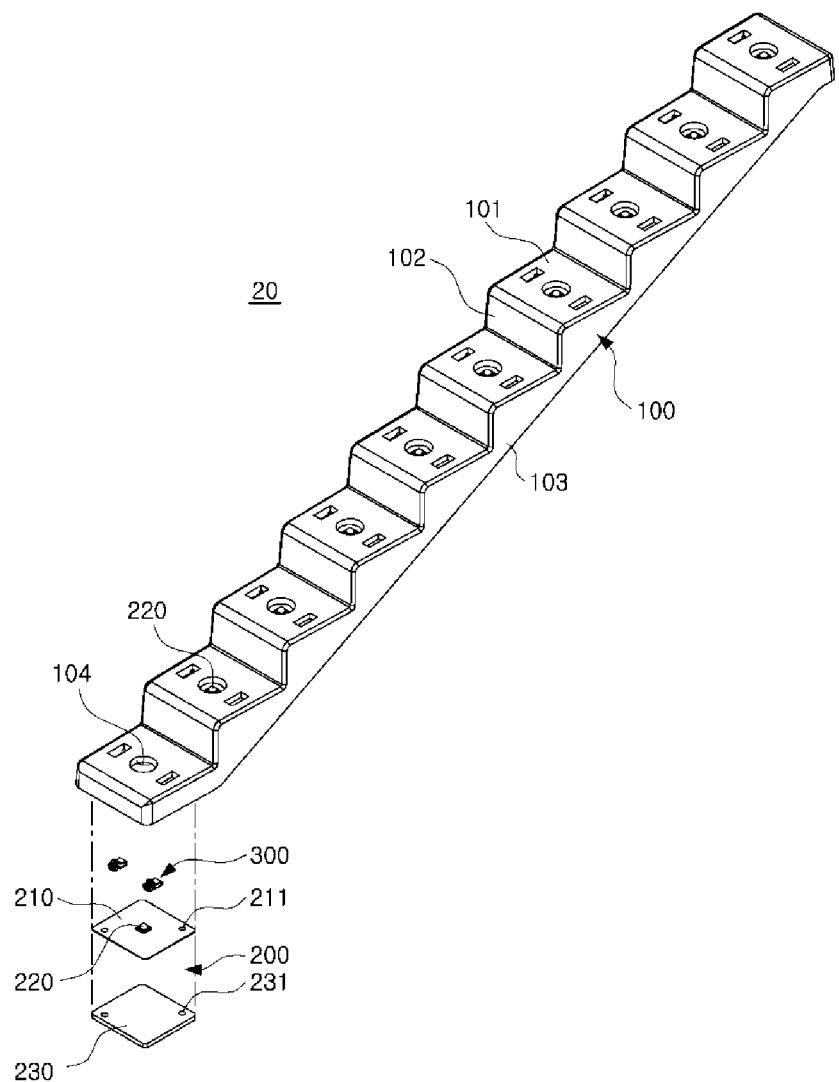
FIG. 9 is a perspective view illustrating a light source module according to other example embodiments.
Figure 10:
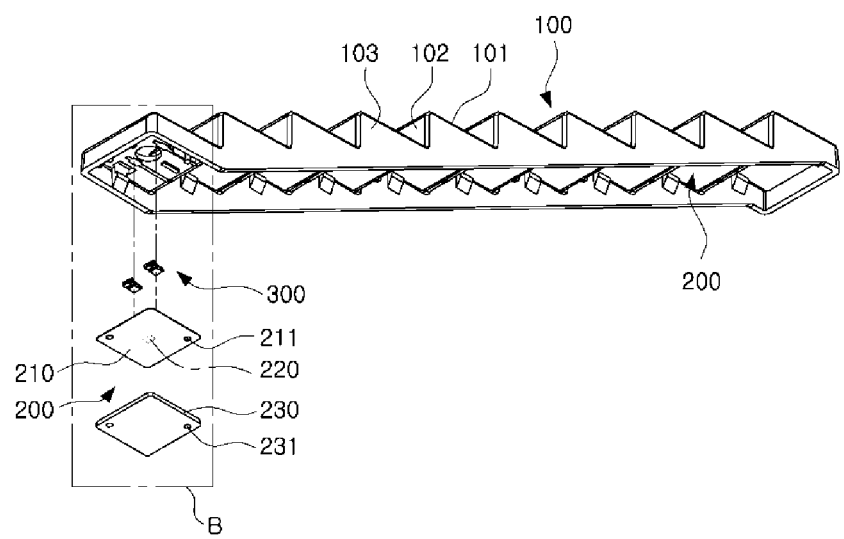
FIG. 10 is a perspective view illustrating the light source module of FIG. 9 viewed from below.
Figure 11:
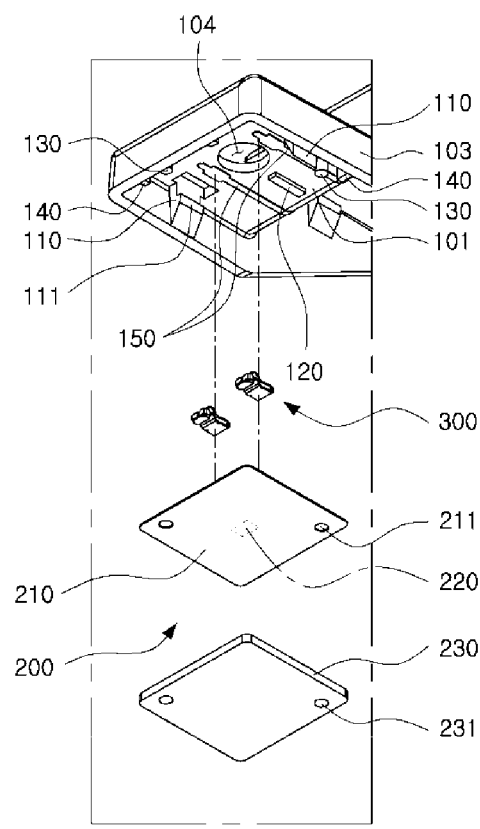
FIG. 11 is an enlarged perspective view of a portion "B" of the light source module of FIG. 10.

FIG. 9 is a perspective view illustrating a light source module according to other example embodiments, FIG. 10 is a perspective view illustrating the light source module of FIG. 9 viewed from below, and FIG. 11 is an enlarged perspective view of a portion "B" of the light source module of FIG. 10.

A basic structure of a light source module 20 according to the example embodiments illustrated in FIGS. 9 through 11 is substantially the same as that of the light source module 10 according to the example embodiments illustrated in FIGS. 1 through 8, except for the frame 100 and a position of the light emitting portion 200 installed in the frame 100. Thus, descriptions of the same components as those of the former example embodiments will be omitted and only a difference will be mainly described.

As illustrated in FIGS. 9 through 11, the light source module 20 according to example embodiments includes the frame 100, the light emitting portion 200, and the connection 300.

The frame 100 includes the plurality of base portions 101, and the plurality of base portions 101 are arranged to be positioned on different levels. The frame 100 may be connected such that the plurality of base portions 101 are positioned on different levels and may have a stepwise structure in which the levels of the plurality of base portions 101 rise in one arrangement direction.

Referring to FIGS. 9 and 10, the frame 100 further includes the connection portion 102 connecting the plurality of base portions 101, and the side portion 103.

Each of the base portions 101 includes the fixing member 110 protruding from a lower surface thereof. The fixing member 110 is disposed as a pair on both edges of each of the base portions 101 in a facing manner. Each of the fixing members 110 includes the protrusions 111 protruding in a facing direction.

The base portion 101 includes the support member 120 provided on the lower surface thereof from which the fixing member 110 protrudes. The support member 120 may be positioned substantially in a central region of the lower surface of the base portion 101. The support member 120 may protrude to have a height lower than the pair of fixing members 110.

The base portion 101 includes the fastening boss 130 provided on the lower surface thereof from which the fixing member 110 protrudes. The fastening boss 130 may protrude from the lower surface of the base portion 101 such that it is longer than the support member 120, and is disposed on both sides, i.e., on the left and right sides, of the support member 120.

The base portion 101 includes the guide member 140 provided on the lower surface thereof from which the fixing member 110 protrudes. The guide member 140 is disposed on both sides, i.e., on the left and right sides, of the support member 120.

The base portion 101 includes a through hole 104 provided substantially in the center thereof. The through hole 104 is disposed to penetrate through upper and lower surfaces of the base portion 101. The through hole 104 may have a size greater than that of a light emitting device 220 of the light emitting portion 200 to accommodate the light emitting device 220.

The frame 100 includes the electrode pattern 150 provided in the plurality of base portions 101. The electrode pattern 150 is disposed on a surface of the frame 100, in detail, on the lower surface of the base portion 101 and the connection portion 102, and exposed externally. The electrode pattern 150 may extend as a pair in parallel to each other in one arrangement direction of the plurality of base portions 101.

That is, the frame 100 according to the example embodiments illustrated in FIGS. 9 through 11 may be understood as being substantially the same as the frame 100 according to the example embodiments illustrated in FIGS. 1 through 8, except that the through hole 104 is further provided at the center of each of the base portions 101, and the fixing member 110, the support member 120, the fastening boss 130, and the guide member 140 are provided to protrude from the lower surface of the base portion 101, rather than from the upper surface thereof.

The light emitting portion 200 may be detachably installed on each of the base portions 101. For example, the light emitting portion 200 may be installed on the lower surface of each of the base portions 101 to which the electrode pattern 150 is exposed.

The light emitting portion 200 includes board 210 having a circuit, the light emitting device 220 mounted on the board 210, and the heat dissipation member 230 disposed below the board 210. The heat dissipation member 230 may have a shape corresponding to the board 210.

Figure 12:
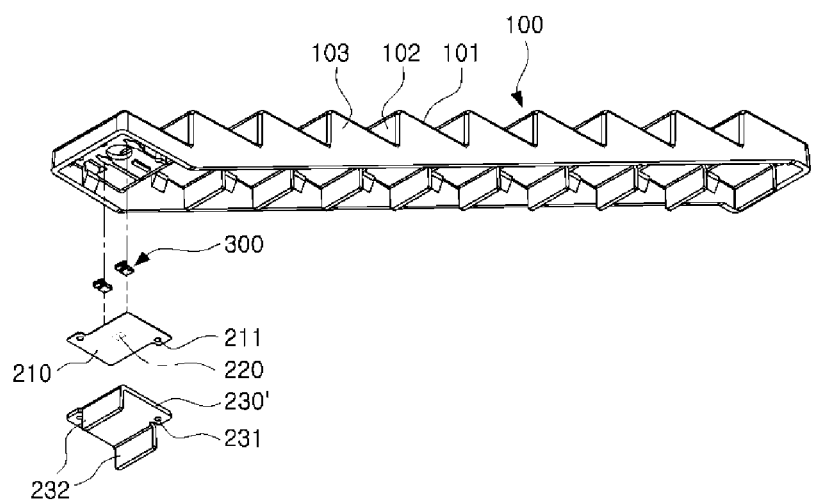
FIG. 12 is a perspective view illustrating a modified example of a light emitting portion of the light source module of FIG. 10.

FIG. 12 is a perspective view illustrating a modified example of the light emitting portion of the light source module of FIG. 10.

As illustrated in FIG. 12, a heat dissipation member 230' includes a pair of heat dissipation fins 232 vertically bent and extending from both edges opposing each other. Thus, the heat dissipation members 230 and 230' may be selectively attached according to outputs from the light emitting device 220 as a heating source, thus enhancing heat dissipation efficiency. For example, in case of a light emitting device for 0.5 W, the heat dissipation member 230 as illustrated in FIGS. 10 and 11 may be attached, and in case of a light emitting device for 1 W, the heat dissipation member 230' as illustrated in FIG. 12 may be selectively attached.

At least a pair of connections 300 is attached to a surface, for example, an upper surface, of the light emitting portion 200 facing the base portion 101. The connections 300 are disposed to correspond to positions of the electrode patterns 150, respectively.

In this manner, in the light source module 20, because the light emitting portion 200 is installed on the lower surface, rather than on the upper surface, of the frame 100, the light emitting portion 200 are surrounded by the base portion 101 and the side portion 103, whereby the light emitting portion 200 may be protected from an external environment.

Also, because the heat dissipation members 230 and 230' may be selectively attached according to outputs from the light emitting device 200, heat dissipation efficiency may be enhanced.

Figure 13A:
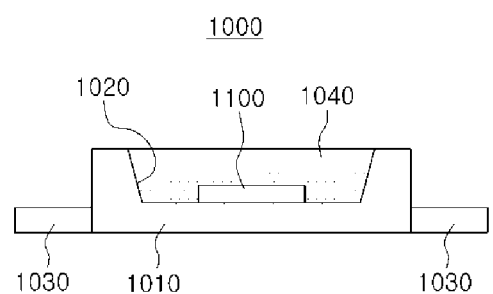
FIGS. 13A and 13B are cross-sectional views illustrating light emitting devices that may be employed in a light source module according to example embodiments.
Figure 13B:
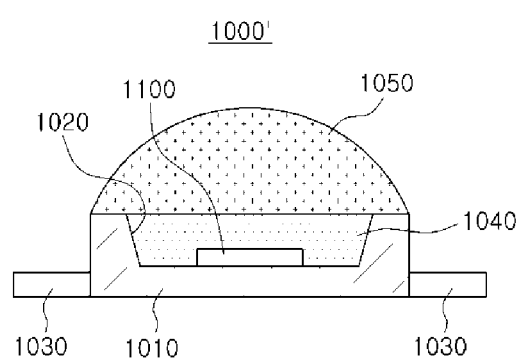

FIGS. 13A and 13B are cross-sectional views illustrating light emitting devices that may be employed in a light source module according to example embodiments.

As illustrated in FIG. 13A, a light emitting device 1000 has a package structure in which an LED chip 1100 is mounted within a body 1010 including a reflective cup 1020.

The body 1010 may allow the LED chip 1100 to be mounted thereon and support the LED chip 1100, and may be formed of a white molding compound having a high degree of light reflectivity. Here, light emitted from the LED chip 1100 may be reflected, bringing about an effect of increasing a quantity of outwardly emitted light. The white molding compound may include thermosetting resins or silicon resins having high heat resistance. Also, white pigment, a filler, a curing agent, a releasing agent, an antioxidant, an adhesive improver, and the like, may be added to a thermoplastic resins. The body 1010 may also be formed of FR-4, CEM-3, an epoxy, ceramics, and the like. Also, the body 1010 may be formed of a metal such as aluminum (Al).

The body 1010 includes a lead frame 1030 mounted on a board for an electrical connection to an external power source. The lead frame 1030 may be formed of a material having excellent electrical conductivity, for example, a metal such as aluminum (Al) or copper (Cu). When the body 1010 is formed of a metal, an insulating material may be interposed between the body 1010 and the lead frame 1030.

The reflective cup 1020 provided in the body 1010 includes a bottom surface on which the LED chip 1100 is mounted, to which the lead frame 1030 is exposed. The LED chip 1100 is electrically connected to the exposed lead frame 1030.

A size of the cross-section of the reflective cup 1020 exposed to an upper surface of the body 1010 is greater than a size of the bottom surface of the reflective cup 1020. Here, the cross-section of the reflective cup 1020 exposed to the upper surface of the body 1010 may define a light emitting surface of the light emitting device 1000.

The LED chip 1100 is sealed by an encapsulant 1040 disposed within the reflective cup 1020 of the body 1010. The encapsulant 1040 may include a wavelength conversion material.

FIG. 13B illustrates a modified example of a light emitting device 1000'. As illustrated in FIG. 13B, a lens 1050 is attached to the body 1010 to cover the encapsulant 1040.

The lens 1050 has a hemispherical shape and is, for example, a convex lens. The lens 1050 may refract light generated by the LED chip 1100 to cause light to be irradiated in a wider range.

At least one or more types of phosphors emitting light having different wavelengths upon being excited by light generated by the LED chip 1100 may be included as a wavelength conversion material in the encapsulant 1040. Accordingly, light in various colors including white light may be adjusted to be emitted.

For example, in a case in which the LED chip 1100 emits blue light, yellow, green, red and/or orange phosphors may be combined to emit white light. Also, at least one of LED chips emitting purple, blue, green, red, and infrared light may be included. In this case, the LED chip 1100 may be adjusted in a color rendering index (CRI) to range from about 40 to 100 and may have a color temperature ranging from about 2000K to 20000K to generate various types of white light. Also, the LED chip 1100 may generate visible light having purple, blue, green, red, orange colors, or infrared light to adjust a color according to a surrounding atmosphere or mood. Also, the LED chip 1100 may generate light having a wavelength stimulating plant growth.

Figure 14:
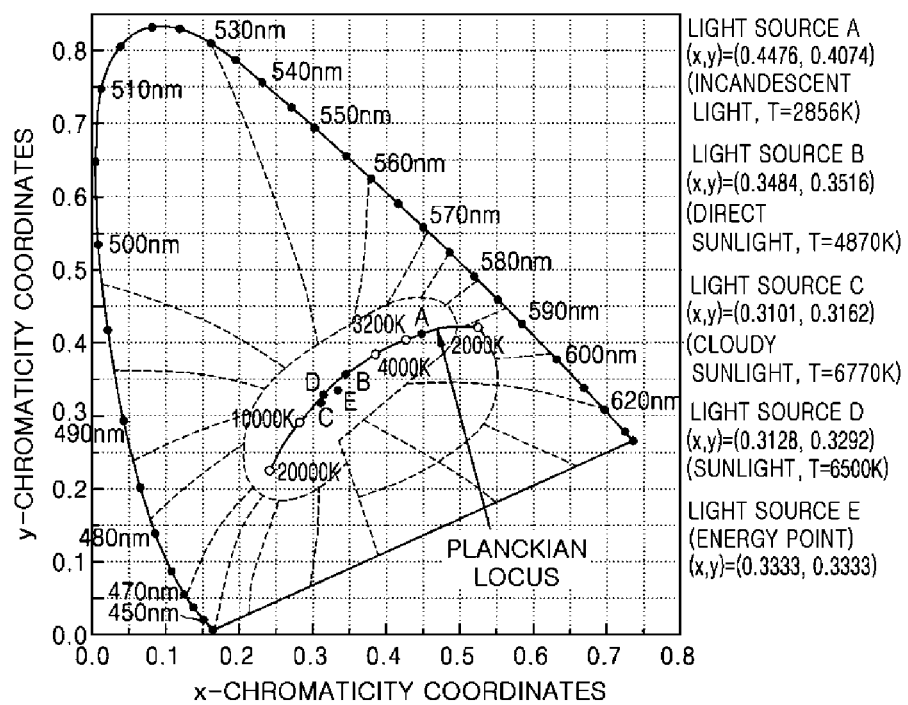
FIG. 14 is a CIE 1931 color space chromaticity diagram illustrating a wavelength conversion material that may be employed in a light source module according to example embodiments.

FIG. 14 is a CIE 1931 color space chromaticity diagram illustrating a wavelength conversion material that may be employed in a light source module according to example embodiments.

White light generated by combining yellow, green, and red phosphors and/or by combining green and red LED chips to a blue LED chip may have two or more peak wavelengths. In the CIE 1931 color space chromaticity diagram illustrated in FIG. 14, (x, y) coordinates may be positioned in a line segment linking (0.4476, 0.4074), (0.3484, 0.3516), (0.3101, 0.3162), (0.3128, 0.3292), and (0.3333, 0.3333) or may be positioned in a region surrounded by the line segment and a spectrum of black body radiation. A color temperature of the white light corresponds to a range from about 2,000K to about 20,000K.

In FIG. 14, white light in the vicinity of the point E (0.3333, 0.3333) present in a lower portion of the spectrum of black body radiation is in a state in which light of a yellow component is relatively weak, which may be used as a light source for illumination in a region in which a vivid or fresh feeling for the naked eye is provided. Thus, lighting products using white light in the vicinity of the point E (0.3333, 0.3333) in the lower portion of the spectrum of black body radiation may be effectively used as lighting of stores selling groceries or clothes.

Phosphors may have the following empirical formulas and colors:

Oxides: Yellow and green $Y_3Al_5O_{12}$:Ce, $Tb_3Al_5O_{12}$:Ce, $Lu_3Al_5O_{12}$:Ce Silicates: Yellow and green $(Ba,Sr)_2SiO_4$:Eu, yellow and orange $(Ba,Sr)_3SiO_5$:Ce Nitrides: Green β-SiAlON:Eu, yellow $La_3Si_6N_{11}$:Ce, orange α-SiAlON:Eu, red $CaAlSiN_3$:Eu, $Sr_2Si_5N_8$:Eu, $SrSiAl_4N_7$:Eu, $SrLiAl_3N_4$:Eu, $Ln_{4-x}(Eu_zM_{1-z})_xSi_{12-y}Al_yO_{3+x+y}N_{18-x-y}$, where $0.5 \leq x \leq 3$, $0 < z < 0.3$, and $0 < y \leq 4$ (Here, Ln may be at least one type of element selected from the group consisting of Group IIIa elements and rare earth elements, and M may be at least one type of element selected from the group consisting of calcium (Ca), barium (Ba), strontium (Sr), and magnesium (Mg))

Fluorides: KSF-based red $K_2SiF_6$:$Mn_4^+$, $K_2TiF_6$:$Mn_4^+$, $NaYF_4$:$Mn_4^+$, $NaGdF_4$:$Mn_4^+$, $K_3SiF_7$:$Mn^{4+}$ Phosphor compositions may conform with Stoichiometry, and respective elements may be substituted with different elements of respective groups of the periodic table. For example, strontium (Sr) may be substituted with barium (Ba), calcium (Ca), magnesium (Mg), and the like, of alkali earths, and yttrium (Y) may be substituted with terbium (Tb), Lutetium (Lu), scandium (Sc), gadolinium (Gd), and the like, of lanthanide series. Also, europium (Eu), an activator, may be substituted with cerium (Ce), terbium (Tb), praseodymium (Pr), erbium (Er), ytterbium (Yb), and the like, according to a desired energy level, and an activator may be applied alone, or a coactivator, or the like, may be additionally applied to change characteristics.

To enhance reliability at high temperatures and high humidity, the fluoride-based red phosphor may be coated with a fluoride not containing manganese (Mn) or may further include an organic substance coated on a surface of the fluoride coating not containing manganese (Mn). Unlike any other phosphor, the fluoride-based red phosphor may realize a narrow full width at half maximum (FWHM) equal to or less than 40 nm, and thus, it may be utilized in high resolution TVs such as UHD TVs.

The wavelength conversion material may include quantum dots (QD) provided to be used in the place of phosphors or mixed with phosphors, and here, a phosphor and a QD may be mixed to be used or only a QD may be used alone.

A QD may have a core-shell structure using Group III-V or Group II-VI compound semiconductors. For example, the quantum dot may have a core such as CdSe or InP or a shell such as ZnS or ZnSe. Also, the quantum dot may include a ligand to stabilize the core and shell. For example, the core may have a diameter ranging from 1 to 30 nm, preferably, 3 to 10 nm. The shell may have a thickness ranging from 0.1 to 20 nm, preferably, 0.5 to 2 nm.

The QD may realize various colors according to sizes, and when the quantum dot is used as a phosphor substitute, it may be used as a red or green phosphor. The use of a quantum dot may realize a narrow FWHM (e.g., about 35 nm).

Figure 15A:
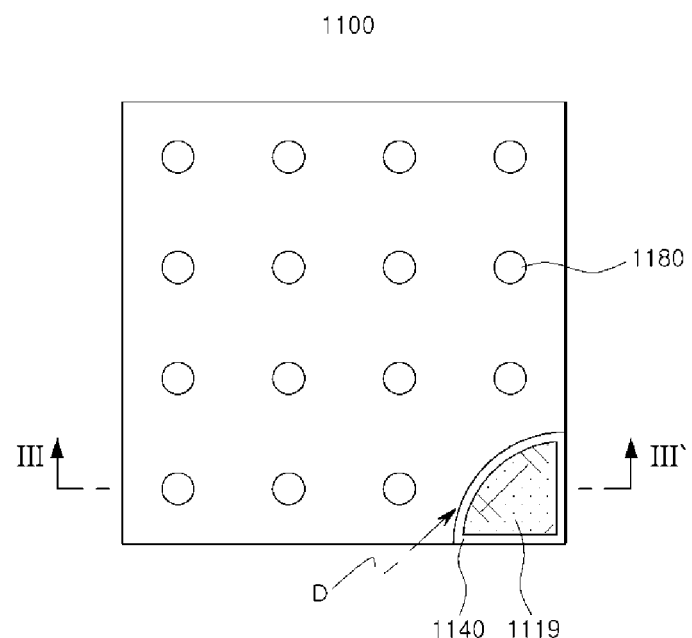
FIGS. 15A, 15B, and 16 are views illustrating an LED chip that may be used in a light emitting device, according to example embodiments.
Figure 15B:
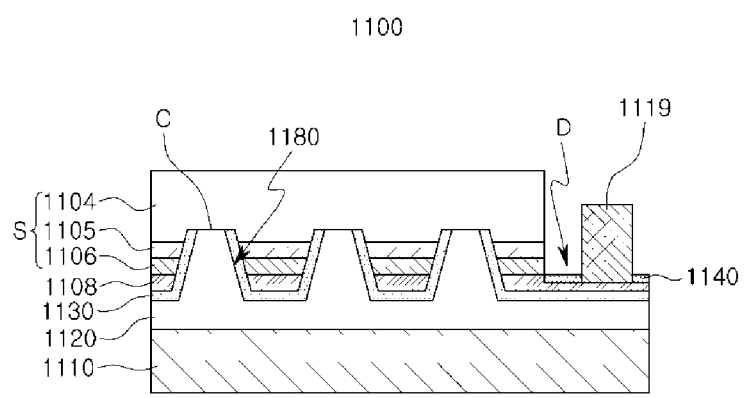
Figure 16:
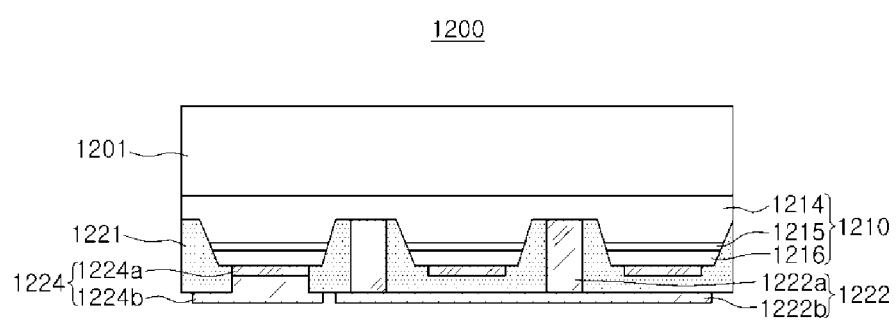

FIGS. 15A, 15B, and 16 are views illustrating an LED chip that may be used in a light emitting device, according to example embodiments.

FIG. 15A is a plan view illustrating an example of an LED chip 1100 that may be employed, and FIG. 15B is a cross-sectional view of the LED chip 1100 taken along line III-III' of FIG. 15A.

The LED chip 1100 illustrated in FIGS. 15A and 15B may have a large structure for a high output for the purpose of lighting (illumination). The LED chip 1100 may have a structure increasing current spreading efficiency and heat dissipation efficiency.

The LED chip 1100 includes a light emitting stacked body S, a first electrode 1120, an insulating layer 1130, a second electrode 1108, and a conductive substrate 1110. The light emitting stacked body S includes a first conductivity-type semiconductor layer 1104, an active layer 1105, and a second conductivity-type semiconductor layer 1106 that are sequentially stacked.

In order for the first electrode 1120 to be electrically connected to the first conductivity-type semiconductor layer 1104, the first electrode 1120 includes at least one conductive portion 1180 extending to at least a region of the first conductivity-type semiconductor layer 1104 and electrically insulated from the second conductivity-type semiconductor layer 1106 and the active layer 1105. The conductive portion 1180 extends from an interface of the first electrode 1120 to the interior of the first conductivity-type semiconductor layer 1104 through the second electrode 1108, the second conductivity-type semiconductor layer 1106, and the active layer 1105. The conductive portion 1180 may be formed using an etching process, such as inductively coupled plasma-reactive ion etching (ICP-RIE), or the like.

The insulating layer 1130 is provided on the first electrode 1120 to electrically insulate the first electrode 1120 from other regions, excluding the first conductivity-type semiconductor layer 1104. As illustrated in FIG. 15B, the insulating layer 1130 is also disposed on a side surface of the conductive portion 1180, as well as between the second electrode 1108 and the first electrode 1120. Thus, the insulating layer 1130 may insulate the first electrode 1120 from the second electrode 1108, the second conductivity-type semiconductor layer 1106, and the active layer 1105 exposed to the side surface of the conductive portion 1180. The insulating layer 1130 may be formed by depositing an insulating material such as $SiO_2$, $SiO_xN_y$, or $Si_xN_y$.

A contact region C of the first conductivity-type semiconductor layer 1104 is exposed by the conductive portion 1180, and a region of the first electrode 1120 is disposed to be in contact with the contact region C through the conductive portion 1180. Accordingly, the first electrode 1120 is connected to the first conductivity-type semiconductor layer 1104.

To reduce contact resistance, the number and a shape of the conductive portions 1180, a pitch between the conductive portions 1180, and a contact diameter (or a contact area) of the conductive portion 1180 with respect to the first and second conductivity-type semiconductor layers 1104 and 1106 may be appropriately adjusted (please refer to FIG. 15A). The conductive portions 1180 may be arranged in various forms in rows and columns to improve current flow. The number of a contact area of the conductive portions 1180 may be adjusted so that the area of the contact region C may range from about 0.1% to 20% of a planar area of the light emitting stacked body S. For example, the area of the contact region C may range from 0.5% to 15%, and preferably, from 1% to 10%. If the area is less than 0.1%, current spreading is not uniform, degrading light emitting characteristics, and if the area is increased to be greater than 20%, the light emitting area may be relatively reduced to reduce light emitting characteristics and luminance.

A radius of the conductive portion 1180 in the region in contact with the first conductivity-type semiconductor layer 1104 may range from 1 μm to 50 μm, for example, and the number of the conductive portions 1180 may be 1 to 48000 per light emitting stacked body S region according to widths of the light emitting stacked body S region. Although varied according to widths of the light emitting stacked body S region, for example, the conductive portion 1180 may be 2 to 45000, preferably, 5 to 40000, and, more preferably, 10 to 35000. A distance between the conductive portions 1180 may range from 10 μm to 1000 μm, forming a matrix structure having rows and columns. For example, the distance between the conductive portions 1180 may range from 50 μm to 700 μm, preferably, from 100 μm to 500 μm, and, more preferably, 150 μm to 400 μm.

If the distance between the conductive portions 1180 is less than 10 μm, the number of vias may be increased to relatively reduce a light emitting area to degrade luminous efficiency, and if the distance is greater than 1000 μm, current spreading is difficult to degrade luminous efficiency. A depth of the conductive portions may be varied according to thicknesses of the second conductivity-type semiconductor layer 1106 and the active layer 1105, and may range from 0.1 μm to 5.0 μm, for example.

As illustrated in FIG. 15B, the second electrode 1108 extends outwardly from the light emitting stacked body S to provide an electrode formation region D. The electrode formation region D includes an electrode pad portion 1119 for connecting an external power source to the second electrode 1108. A single electrode formation region D is illustrated, but a plurality of electrode formation regions may be provided. As illustrated in FIG. 15A, the electrode formation region D is disposed at the corner of one side of the LED chip 1100 to maximize a light emitting area.

As in example embodiments, an etch stop insulating layer 1140 is disposed around the electrode pad portion 1119. The etch stop insulating layer 1140 may be formed in the electrode formation region D after the formation of the light emitting stacked body S or before the formation of the second electrode 1108, and may act as an etching stop during an etching process for the electrode formation region D.

The second electrode 1108 may be formed of a material having high reflectivity, while forming ohmic contact with the second conductivity-type semiconductor layer 1106. As the material of the second electrode 1108, the reflective electrode material mentioned above may be used.

FIG. 16 is a cross-sectional view illustrating an example of an LED chip 1200 that may be employed.

Referring to FIG. 16, the LED chip 1200 includes a semiconductor stacked body 1210 disposed on a substrate 1201. The semiconductor stacked body 1210 includes a first conductivity-type semiconductor layer 1214, an active layer 1215, and a second conductivity-type semiconductor layer 1216.

The LED chip 1200 includes first and second electrodes 1222 and 1224 respectively connected to the first and second conductivity-type semiconductor layers 1214 and 1216. The first electrode 1222 includes a connection electrode portion 1222a such as a conductive portion connected to the first conductivity-type semiconductor layer 1214 through the second conductivity-type semiconductor layer 1216 and the active layer 1215, and a first electrode pad 1222b connected to the connection electrode portion 1222a.

The connection electrode portion 1222a is surrounded by an insulating portion 1221 to be electrically separated from the active layer 1215 and the second conductivity-type semiconductor layer 1216. The connection electrode portion 1222a is disposed in a region from which the semiconductor stacked body 1210 has been etched. The number and shape of the connection electrode portion 1222a, a pitch between the connection electrode portions 1222a, and contact resistance of the connection electrode portion 1222a with respect to the first conductivity-type semiconductor layer 1214 may be appropriately designed in such a manner that contact resistance is reduced. Also, the connection electrode portions 1222a may be arranged in rows and columns on the semiconductor stacked body 1210 to improve current flow. The second electrode 1224 includes an ohmic contact layer 1224a and a second electrode pad 1224b on the second conductivity-type semiconductor layer 1216.

The connection electrode portion 1222a and the ohmic contact layer 1224a may be formed of a conductive material having ohmic characteristics with respect to the first and second conductivity-type semiconductor layers 1214 and 1216, and may have a monolayer or a multilayer structure. For example, the connection electrode portion 1222a and the ohmic contact layer 1224a may be formed of one or more of materials such as silver (Ag), aluminum (Al), nickel (Ni), chromium (Cr), and a transparent conductive oxide (TCO) through a process such as deposition or sputtering.

The first and second electrode pads 1222b and 1224b are respectively connected to the connection electrode portion 1222a and the ohmic contact layer 1224a to serve as external terminals of the LED chip 1200. For example, the first and second electrode pads 1222b and 1224b may include Au, Ag, Al, Ti, W, Cu, Sn, Ni, Pt, Cr, NiSn, TiW, AuSn, or a eutectic metal thereof.

The first and second electrodes 1222 and 1224 may be disposed in the same direction, and may be mounted on a lead frame, or the like, in a so-called flip-chip manner.

The first and second electrodes 1222 and 1224 are electrically separated by the insulating portion 1221. The insulating portion 1221 may be formed of any material as long as the material has electrical insulating properties, and any object having electrical insulating properties may be employed. However, an insulating material having low light absorption may be used. For example, the insulating portion 1221 may be formed of a silicon oxide or a silicon nitride such as $SiO_2$, $SiO_xN_y$, or $Si_xN_y$. The insulating portion 1221 may have a light reflective structure by dispersing a light reflective filler in a translucent material. Alternatively, the insulating layer 1221 may have a multilayer reflective structure in which a plurality of insulating films having different refractive indices are alternately stacked. For example, the multilayer reflective structure may be a distributed Bragg reflector (DBR) in which a first insulating film having a first reflective index and a second insulating film having a second refractive index are alternately stacked.

The multilayer reflective structure may be formed by repeatedly stacking a plurality of insulating films having different refractive indices at least twice to a hundred of times. For example, the multilayer reflective structure may be formed by repeatedly stacking insulating films three to seventy times, or preferably, may be formed by repeatedly stacking insulating films four to fifty times.

The plurality of insulating films of the multilayer reflective structure may be an oxide or a nitride such as $SiO_2$, SiN, $SiO_xN_y$, $TiO_2$, $Si_3N_4$, $Al_2O_3$, TiN, AlN, $ZrO_2$, TiAlN, or TiSiN, of combinations thereof. For example, when a wavelength of light generated by the active layer 1215 is λ and n is a refractive index of a corresponding layer, the first and second insulating films may be formed to have a thickness of λ/4 n and may have a thickness ranging from about 300 Å to 900 Å. Here, the multilayer reflective structure may be designed in such a manner that refractive indices and thicknesses of the first insulating film and the second insulating film are selected to have a high degree of reflectivity (95% or greater) with respect to a wavelength of light generated by the active layer 1215.

Refractive indices of the first and second insulating films may be determined within a range of about 1.4 to about 2.5, which may be lower than a refractive index of the first conductivity-type semiconductor layer 1214 and a refractive index of the substrate, or may be lower than the refractive index of the first conductivity-type semiconductor layer 1214 but greater than the refractive index of the substrate.

Figure 17:
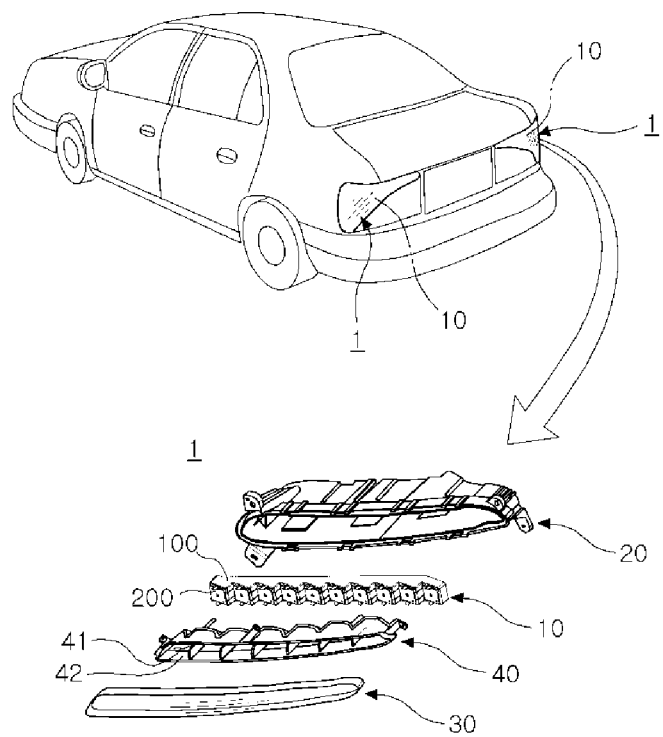
FIG. 17 is a perspective view illustrating a lighting device employing a light source module according to example embodiments.

FIG. 17 is a perspective view illustrating a lighting device employing a light source module according to example embodiments. The lighting device according to example embodiments may include, for example, a taillight of an automobile.

As illustrated in FIG. 17, a lighting device 1 includes a housing 20 in which the light source module 10 is supported, a cover 30 covering the housing 20 to protect the light source module 10, and a reflector 40 disposed on the light source module 10. The reflector 40 includes a plurality of reflective surfaces 42 and a plurality of through holes 41 provided on a bottom surface of each of the reflective surfaces 42, and in the light emitting portion 200 of the light source module 10, the light emitting device 220 may be exposed to the reflective surfaces 42 through the through holes 41, respectively.

The lighting device 1 may have an overall gentle, curved structure to correspond to a shape of a corner portion of the automobile. Thus, the frame 100 and the plurality of light emitting portions 200 installed thereto may form the light source module 10 having a step structure corresponding to the curved structure of the lighting device 1. The structure of the light source module 10 may be variously modified according to a design of the lighting device 1, i.e., the taillight.

In example embodiments, a case in which the lighting device 1 is a taillight of an automobile is illustrated, but the example embodiments are not limited thereto.

Figure 18:
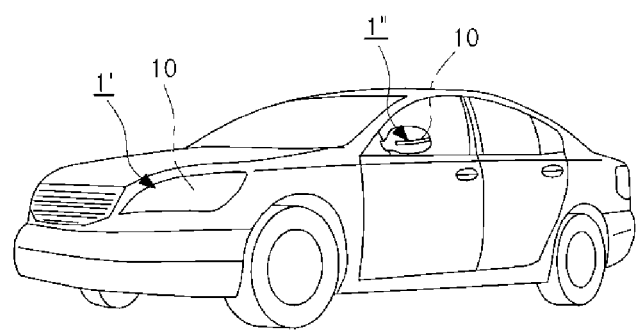
FIG. 18 is a perspective view illustrating a lighting device employing a light source module according to other exemplary embodiments.

FIG. 18 is a perspective view illustrating a lighting device employing a light source module according to other exemplary embodiments. For example, as illustrated in FIG. 18, a lighting device 1' includes a headlamp of an automobile, and the light source module 10 may have a multistep structure corresponding to a curved surface of the headlamp.

Also, a lighting device 1" includes a turn signal lamp installed in a door mirror of the automobile. Similarly, the light source module 10 may be easily assembled to have a form corresponding to a curved surface of the turn signal lamp.

As set forth above, according to the example embodiments, a structure of the light emitting portions installed in the light source module is standardized, and only a light emitting portion having an error, among the plurality of light emitting portions, may be replaced, whereby the light source module facilitating maintenance and a lighting device including the same may be provided.

Although the example embodiments have been shown and described, it would be appreciated by those skilled in the art that changes may be made in the example embodiments without departing from the principles and spirit of the disclosure, the scope of which is defined in the claims and their equivalents.

What is claimed is:

1. A light source module comprising:
   a frame comprising base portions disposed on different levels, respectively, and an pair of electrode patterns disposed on top of the base portions;
   light emitting portions, having a light emitting device, detachably disposed on the base portions, respectively; and
   connections having elasticity and electrical conductivity, the connections being respectively disposed between the light emitting portions and the frame, and the connections being in contact with the electrode patterns and the light emitting portions and configured to supply power from the electrode patterns to the light emitting portions,
   wherein each of the connections comprises:
   a first body portion disposed on a respective one of the light emitting portions, the first body portion comprising a first surface physically contacting a second surface opposite the light emitting device of the respective one of the light emitting portions;
   a bent portion integrally extending from a first end of the first body portion, the bent portion being configured to elastically deform in response to external force that is applied to the bent portion, to generate repellent force; and
   a second body portion integrally extending from a second end of the bent portion and facing the first body portion, the second body portion comprising a third second surface physically contacting one of the pair of a fourth surface of the electrode patterns.

2. The light source module of claim 1, wherein the second body portion comprises a contact portion that is bent outwardly from a third end of the second body portion, the contact portion contacting the electrode pattern.

3. The light source module of claim 1, wherein a pair of the connections is disposed on a top/bottom surface of each of the light emitting portions, the top/bottom surface facing a respective one of the base portions, and
   wherein the pair of the connections is further disposed on the electrode pattern.

4. The light source module of claim 1, wherein the frame has a stepwise structure in which the base portions are disposed on gradually higher levels in an arrangement direction.

5. The light source module of claim 1, wherein the frame comprises fixing members protruding from a top or bottom surface of each of the base portions, the fixing members facing each other, and the fixing members being configured to fix the light emitting portions respectively to the base portions.

6. The light source module of claim 5, wherein the fixing members comprise protrusions facing each other.

7. The light source module of claim 1, wherein the frame comprises through holes respectively disposed in the base portions.

8. The light source module of claim 1, wherein the frame further comprises a support member protruding from a top or bottom surface of each of the base portions, the support member being configured to space apart each of the light emitting portions from a respective surface of the base portions.

9. The light source module of claim 1, wherein each of the light emitting portions comprises a fastening hole, and
wherein the frame further comprises a fastening boss protruding from a top or bottom surface of each of the base portions, the fastening boss being configured to be inserted through the fastening hole, to fasten a respective one of the light emitting portions to a respective one of the base portions and to restrain slidable movement of the respective one of the light emitting portions.

10. The light source module of claim 1, wherein the frame further comprises a connection portion disposed between the base portions, the connection portion connecting the base portions, and the connection portion being vertically connected to each of the base portions.

11. The light source module of claim 1, wherein each of the light emitting portions comprises a board comprising a circuit, and a light emitting device disposed on the board.

12. The light source module of claim 11, wherein the light emitting portion further comprises a heat dissipation member disposed below the board.

13. The light source module of claim 1, wherein the electrode pattern is exposed externally on a top or bottom surface of each of the base portions, and
wherein the light emitting portions are disposed on the exposed electrode pattern.

14. A light source module comprising:
a frame comprising a top/bottom surface having a stepwise structure, and comprising an pair of electrode patterns exposed externally on the top/bottom surface;
light emitting portions, having a light emitting device, detachably disposed on different levels of the top/bottom surface; and
connections having elasticity and electrical conductivity, the connection being respectively disposed on the light emitting portions, and the connections being configured to connect to the electrode pattern to the light emitting portions to provide power from the electrode pattern to the light emitting portions disposed on the different levels of the top/bottom surface,
wherein each of the connections comprises:
a first body portion disposed on a respective one of the light emitting portions, the first body portion comprising a first surface physically contacting a second surface opposite the light emitting device of the respective one of the light emitting portions;
a bent portion integrally extending from a first end of the first body portion, the bent portion being configured to elastically deform in response to external force that is applied to the bent portion, to generate repellent force; and
a second body portion integrally extending from a second end of the bent portion and facing the first body portion, the second body portion comprising a third second surface physically contacting one of the pair of a fourth surface of the electrode patterns.

15. The light source module of claim 14, wherein in response to the light emitting portions being disposed on the different levels of the top/bottom surface, the connections are configured to generate the repellent force toward the electrode pattern.

16. The light source module of claim 14, wherein the connections are respectively disposed between the light emitting portions and the electrode pattern.

17. A lighting device comprising:
a light source module;
a housing supporting the light source module; and
a cover fastened to the housing and covering the light source module, wherein the light source module comprises:
a frame comprising mounting regions disposed on different levels, respectively, and an pair of electrode patterns exposed externally on the mounting regions;
light emitting portions, having a light emitting device, detachably disposed on the mounting regions, respectively; and
connections having elasticity and electrical conductivity, the connections being respectively disposed between the light emitting portions and the frame, and the connections being in contact with the electrode patterns and the light emitting portions and configured to supply power from the electrode pattern to the light emitting portions
wherein each of the connections comprises:
a first body portion disposed on a respective one of the light emitting portions, the first body portion comprising a first surface physically contacting a second surface opposite the light emitting device of the respective one of the light emitting portions;
a bent portion integrally extending from a first end of the first body portion, the bent portion being configured to elastically deform in response to external force that is applied to the bent portion, to generate repellent force; and
a second body portion integrally extending from a second end of the bent portion and facing the first body portion, the second body portion comprising a third second surface physically contacting one of the pair of a fourth surface of the electrode patterns.

18. The lighting device of claim 17, further comprising a reflector configured to reflect light from the light source module.

19. The lighting device of claim 18, wherein the reflector comprises reflective surfaces, and through-holes disposed in a bottom surface of each of the reflective surfaces, the through-holes exposing the reflective surfaces respectively to the light emitting portions.

* * * * *